United States Patent [19]
Chi

[11] Patent Number: 5,173,437
[45] Date of Patent: Dec. 22, 1992

[54] DOUBLE POLYSILICON CAPACITOR FORMATION COMPATABLE WITH SUBMICRON PROCESSING

[75] Inventor: Keh-Fei C. Chi, Singapore, Singapore

[73] Assignee: Chartered Semiconductor Manufacturing Pte Ltd, Singapore, Singapore

[21] Appl. No.: 739,222

[22] Filed: Aug. 1, 1991

[51] Int. Cl.⁵ .............................................. H01L 21/70
[52] U.S. Cl. ........................................ 437/60; 437/47; 437/48; 437/52; 437/228; 437/229; 437/919
[58] Field of Search ...................... 431/47, 48, 52, 60, 431/919, 229; 357/23.6; 365/149

[56] References Cited

U.S. PATENT DOCUMENTS 5,037,772  8/1991  McDonald ........................ 437/919

FOREIGN PATENT DOCUMENTS

| 0013269 | 1/1979 | Japan | 437/229 |
| 0093331 | 7/1981 | Japan | 437/229 |
| 0022355 | 2/1985 | Japan . | |
| 0183623 | 6/1985 | Japan . | |
| 0128460 | 5/1989 | Japan | 437/919 |

Primary Examiner—Tom Thomas
Attorney, Agent, or Firm—George O. Saile

[57] ABSTRACT

A method for fabricating an integrated circuit having a double polysilicon capacitors and metal oxide silicon field effect devices which are compatible to one micrometer or less processing is described. First, a pattern of recessed oxide isolation is formed on the surface of a silicon substrate. The pattern separates surface regions of silicon from other such regions. A gate dielectric layer is formed on the surface of surface regions of the silicon with a suitable dopant concentration. A first polysilicon layer is formed over the gate dielectric layer and over the field oxide having a suitable doping concentration. An interpoly dielectric layer is formed over the surface of the first polysilicon layer. A second poly silicon layer is formed over the interpoly dielectric layer having a suitable doping concentration. The second polysilicon layer is patterned using a first resist masking and suitable etching to leave only the top plate of the capacitor in the second polysilicon layer. The interpoly dielectric layer is removed except where it is located beneath the top plate by using top plate of the capacitor in second polysilicon layer as the etching mask. The first polysilicon layer is now patterned using a second resist masking and suitable etching to leave only the bottom plate of the capacitor and the gate electrode of the transistor in the first polysilicon layer. The second resist masking layer is removed. The elements of the integrated circuit are completed by conventional processing.

16 Claims, 2 Drawing Sheets

DOUBLE POLYSILICON CAPACITOR FORMATION COMPATABLE WITH SUBMICRON PROCESSING

BACKGROUND OF THE INVENTION (1) Field of the Invention

The invention relates to the manufacture of highly dense integrated circuits and more particularly to the formation of metal oxide silicon field effect devices and double polycrystalline silicon capacitors within the integrated circuit.

(2) Description of the Prior Art

In recent years there continues to be dramatic density increases in the integrated circuit technology. The minimum feature size of lithography has been reduced to one minimum feature size of lithography has been reduced to one micrometer and below. As would be expected,, manufacturing problems involving device yield, reliability and cost have increased with this reduction in feature size.

One of the problems encountered is the polycrystalline silicon "stringer". These "stringer" are unwanted leftovers from etching, usually a directional reactive ion etch of a layer of polycrystalline silicon over irregular surfaces. To remove these "stringer" it is necessary to overetch the polycrystalline silicon layer which results in an undesired thinner layer, linewidth reduction and/or damage to the underlayer.

This "stringer" problem has been encountered in the DRAM technology and a solution patented by T. A. Lowrey et al U.S. Pat. No. 4,957,878. The problem was encountered where the capacitor to substrate layer was the polysilicon layer I and the gate electrode of the transistor was polysilicon II. The novel solution was to reverse the layer applications, that is the polysilicon layer 1 was made the transistor gate electrode and the polysilicon layer II was made the capacitor to substrate layer. This approach in DRAM technology establishes the critical dimensions at preliminary mask layers and subsequent layers do not require the high degree of criticality of dimension.

The "stringer" problem that applicant is concerned with involves the formation of an analog integrated circuit composed of a double polycrystalline capacitor and a field effect transistor combination, not the DRAM integrated circuit technology of the above described Lowery et al Patent.

The FIGS. 1 through 4 shows the process that is used to manufacture the double polycrystalline silicon capacitor and field effect transistor integrated circuit which has the "stringer" problem. FIG. 1 shows a monocrystalline silicon semiconductor substrate 10 having a pattern 12 or FOX (field oxide) of recessed oxide isolation on the surface of the silicon substrate which pattern separates surface regions of silicon from other such regions. A polycrystalline silicon layer 14 is blanket deposited and doped over the surfaces and then patterned by lithography and etching techniques to leave the polysilicon I layer 14 as the bottom plate for the capacitor on the recessed oxide isolation 12. An interpoly layer 16 composed of, for example silicon oxide layer 18 and silicon nitride layer 20 are formed over the structure and the silicon nitride layer is patterned by lithography and etching to give the FIG. 1 structure.

FIG. 2 shows the structure after the deposition of polysilicon layer II 22. Lithography and etching of the FIG. 2 layer 22 is accomplished by formation of resist masking layer 24 as seen in FIG. 3. The etching leaves the top plate of the capacitor 25 and the gate electrode 23 of the field effect transistor device. However, the unwanted "stringers" 30 are left on the irregular surfaces, such as seen around the edge of polysilicon I 14. This is very difficult to fully remove even with the overetching of the polysilicon II layer. The process continues to produce the FIG. 4 structure by the lightly doped ion implantation to form N-regions 32, sidewall oxide regions 34, heavily doped ion implantation to form N+ regions 36, passivation layer 38 and metallurgy contacts 40 to the various elements of the integrated circuits. However, some of the "stringers" 30 still remain in the structure even with overetching.

The present of "stringers" in this analog integrated circuit of FIG. 4 is a problem because the use of overetching to remove these "stringers" is incompatible with submicrometer processing. The reason is that submicron devices have thinner gate oxide under the polysilicon II electrode. Overetching can cause damage to the substrate as thinner gate oxide is more difficult to withstand overetching. In addition, overetching produces linewidth loss whose magnitude varies with pattern density (known as microloading effect), contributing to the linewidth variation of polysilicon critical dimension, a more serious problem for submicron processing.

SUMMARY OF THE INVENTION

It is therefor a principal object of the invention to provide a method for making a double polycrystalline silicon capacitor and field effect transistor integrated circuit which by the nature of the method will not allow the production of "stringers" with their attendant problems.

It is further object of the invention to provide a method that will not produce "stringers" because the gate electrode is formed with the polysilicon I which allows precise dimensional control and the capacitor mask is eliminated by etching the interpoly dielectric using the top plate polysilicon II as the mask.

These objects are achieved by fabricating an integrated circuit having a double polycrystalline silicon capacitors and metal oxide silicon field effect devices which are compatible to one micrometer or less processing. A pattern of recessed oxide isolation is formed on the surface of a monocrystalline silicon substrate. The pattern separates surface regions of silicon from other such regions. A gate dielectric layer is formed on the surface of surface regions of the silicon with a suitable dopant concentration. A first polycrystalline silicon layer is formed over the gate dielectric layer and over the field oxide having a suitable doping concentration. An interpoly dielectric layer is formed over the surface of the first polycrystalline silicon layer. A second polycrystalline silicon layer is formed over the interpoly dielectric layer having a suitable doping concentration. The second polycrystalline silicon layer is patterned using a first resist masking and suitable etching to leave only the top plate of the capacitor in the second polycrystalline silicon layer. The interpoly dielectric layer is removed except where it is located beneath the top plate by using top plate of the capacitor in second polycrystalline silicon layer as the etching mask. The first polycrystalline silicon layer is now patterned using a second resist masking and suitable etching to leave only the bottom plate of the capacitor and the gate electrode of the transistor in the first polycrystalline silicon layer. The second resist masking layer is removed. The elements of the integrated circuit are completed. Appropriate electrical connections are made to the device elements to thereby form the integrated circuit.

DESCRIPTION OF THE PREFERRED EMBODIMENTS

Figure 1:
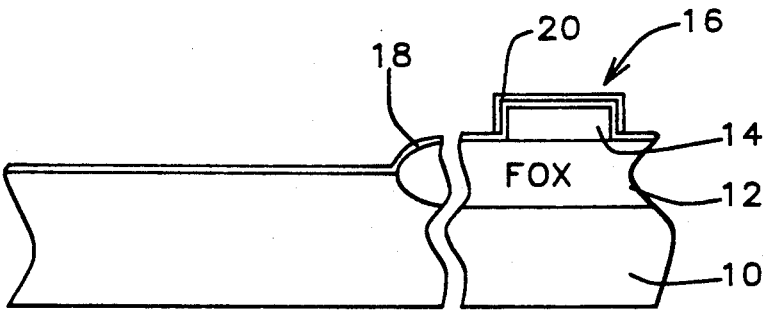
FIGS. 1 to 4 is a schematic cross-sectional representation of a Prior Art process for fabricating an analog integrated circuit composed of field effect transistor devices and double polysilicon capacitors.
Figure 2:
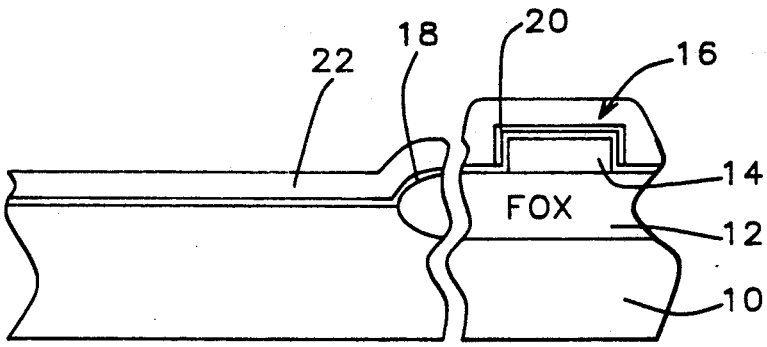
Figure 3:
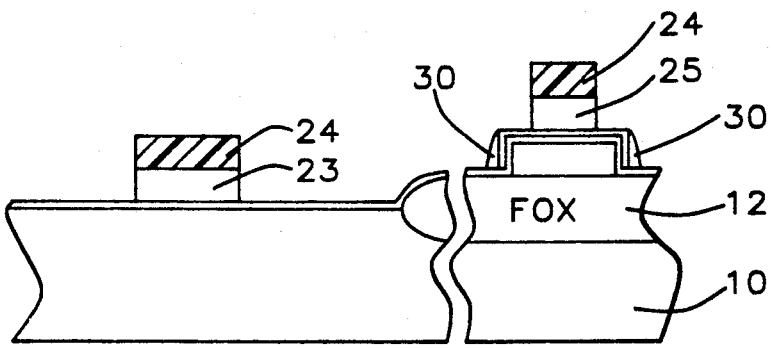
Figure 4:
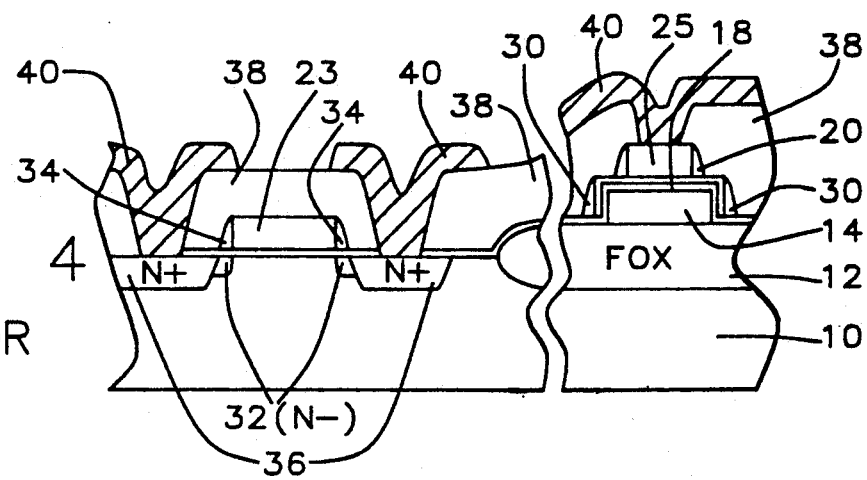
Figure 5:
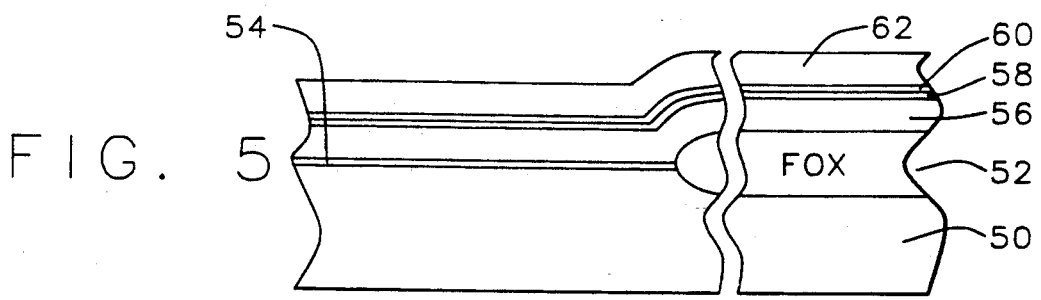
FIGS. 5 to 8 is a schematic cross-sectional representation of a new method for fabricating an analog integrated circuit composed of field effect transistor devices and double polysilicon capacitors which do not have the "stringer" problem of the prior art.

Referring now more particularly to FIG. 5, there is shown an embodiment method for making the lightly doped drain device of the present invention. The first series of steps involve the formation of the dielectric isolation regions for isolating semiconductor surface regions from other such regions in the semiconductor substrate 50. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal silicon oxide which in effect sinks into the silicon surface at the unmasked areas. The masked silicon remains as a mesa surrounded by the sunken silicon dioxide or Field Oxide pattern, FOX 52. Then semiconductor devices can be provided in the silicon mesas within recessed oxide isolation pattern according to the following processes.

The surface of the silicon substrate 50 is thermally oxidized to form the desired gate dielectric oxide 54 thickness. The preferred thickness is between about 70 to 200 Angstroms. The polysilicon I layer 56 is blanket deposited by LPCVD (Low Pressure Chemical Vapor Deposition) method. The preferred thickness of the polysilicon layer 56 is between about 1500 to 5000 Angstroms. The polysilicon layer 56 is ion implanted with phosphorous or arsenic ions under the conditions 1 to 10 E 15 dosage per area and 20 to 80 Kev. or doped with phosporus oxychloride at a temperature about 900° C.

An interpoly dielectric layer is formed over the polysilicon I layer 56. In this embodiment, we shown the dielectric as two layers, the first layer is silicon oxide 58 and the second layer is silicon nitride 60. The conditions for forming the silicon oxide layer 58 are by thermal oxidation at a temperature of about 900° C. The preferred thickness of this layer is between about 100 to 400 Angstroms. The conditions for forming the silicon nitride layer 58 is also by low pressure chemical vapor deposition at a temperature of about 750° C. The preferred thickness of the silicon nitride layer is between about 100 to 300 Angstroms. The total thickness of the interpoly dielectric layer is between about 200 to 700 Angstroms. Other dielectrics can be substituted such as ONO (oxide-nitride-oxide), silicon oxide alone, etc. the preferred thicknesses for these dielectrics are between about 400 to 600 Angstroms.

The polysilicon II layer 62 is blanket deposited by LPCVD (Low Pressure Chemical Vapor Deposition) method. The preferred thickness of the polysilicon layer 62 is between about 1500 to 5000 Angstroms. The polysilicon layer 62 is ion implanted with phosphorous or arsenic ions under the conditions 1 to 10 E 15 dosage per area and 20 to 80 Kev. or doped with phosphorus oxychloride at a temperature about 900° C.

Figure 6:
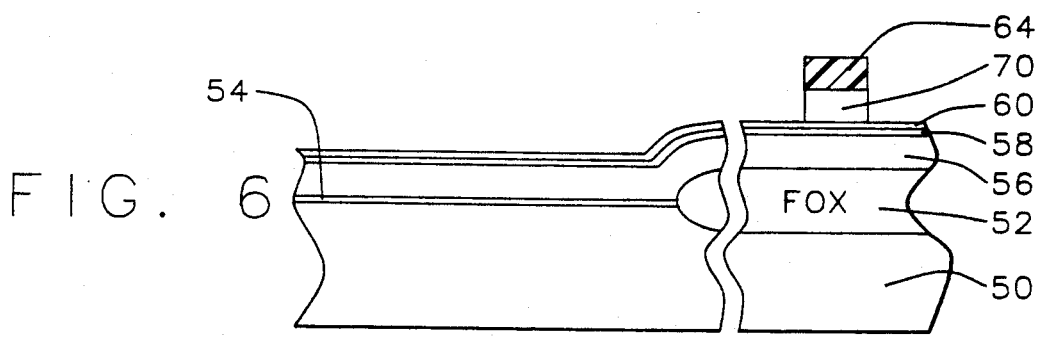

The polysilicon II layer 62 is patterned using a first resist making layer 64 and suitable etching to lease only the top plate 70 of the capacitor. The lithography and etching is conventional. The preferred etching process is reactive ion etching using HCl or HBr with oxygen at room temperature or lower. This completes FIG. 6.

The interpoly layer 58, 60 is now removed using the resist masking layer 64 and top plate 70 as the mask. The preferred etching process for the combination of silicon nitride and silicon oxide combined layer uses conventional fluorine reactive ion etching techniques.

Figure 7:
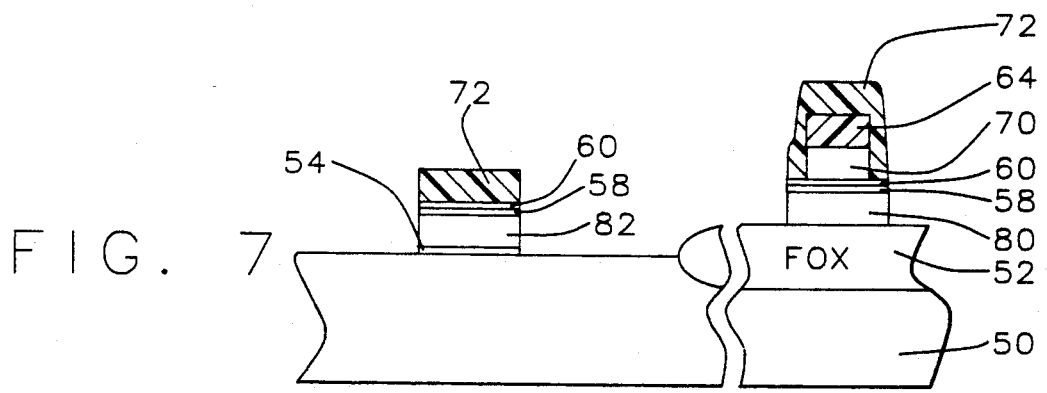

A second resist masking layer 72 is formed by conventional lithography techniques of spin deposition, exposure through a mask and development. This masking layer 72 is preferred to be larger than the first masking layer 64, so that it covers the entire masking layer and the top plate 70 as can be seen in FIG. 7. The masking layer 72 also is formed where the desired gate electrode of the field effect transistors are desired.

A suitable etching process to etch first polysilicon I layer 56 which is similar to that described in regard to the etching of the second polysilicon II layer 62. The result of the etching process is shown in FIG. 7. wherein the bottom plate 80 of the capacitor and the gate electrode 82 of the transistor have been formed.

The first and second resist masking layers 64 and 72 are now removed by conventional resist stripping methods. It is preferred to leave the first resist layer 64 during the etching steps, because it serves as extra protection during subsequent etching.

Figure 8:
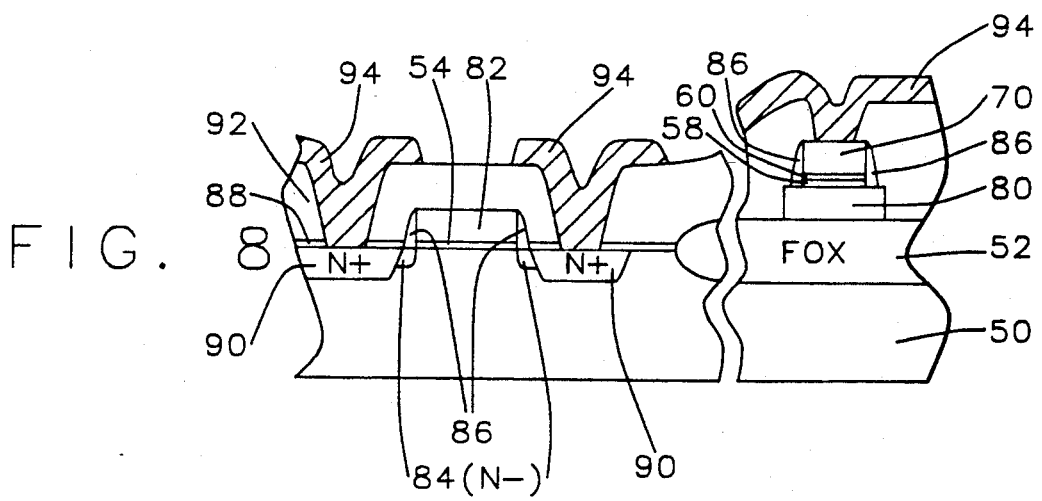

The source/drain structure of the MOS FET may now be formed by the following steps. The FIG. 8 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate using opposite polarity wells in the substrate for N and P channel devices as is understood in the art.

FIG. 8, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 84 is done with, for example phosphorous P31 at a dose of between about 1 to 10 E 13 atoms/cm.$^2$ and with an energy of between about 20 to 40 Kev.

The dielectric spacer 86 is now to be formed followed by the completion of the lightly doped drain source/drain structures and the double polysilicon capacitor. A low temperature silicon oxide deposition is preferred such as through the chemical vapor deposition of the tetraethoxysysilane (TEOS) at a temperature in the range of between about 300 to 700° C. wherein the low temperature range process uses plasma enhanced CVD. Other silicon oxide deposition methods include silane based LPCVD. The thickness of the dielectric silicon dioxide layer 86 is between about 2000 to 5000 Angstroms and preferably about 2500 Angstroms.

An anisotropic etching of this layer produces the dielectric spacer layer 86 on the sidewalls of the vertical gate electrode and capacitor layered structures. The preferred anisotropic etching uses a conventional reactive ion etching ambient.

A thin silicon oxide, silicon nitride or the like surface damage masking layer 88 is formed upon the layer structure regions, the spacers and the exposed monocrystalline silicon substrate regions (note the drawing does not show the complete layer, only in the important areas covering the source/drains). The conditions for forming this layer 88 are LPCVD deposition of TEOS or LPCVD silicon nitride deposition at about 600° to 900° C. The preferred thickness of this oxide layer is between about 200 to 1000 Angstroms and a preferred thickness of about 600 Angstroms.

Alternatively to the use of layer 88, a refractory metal can be deposited over the surface, followed by ion implantation and a allowing step to form metal silicide over the silicon substrate and polysilicon areas.

The N+ source/drain ion implantation is done using Arsenic, As75 with a dose of between about 2 E 15 to 1 E 16 atoms/cm.$^2$ and energy of between about 20 to 70 Kev. to complete the source/drain regions 90 of the N channel lightly doped drain MOS FET integrated circuits device as seen in the FIG. 8.

An insulating structure 92 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angrstroms for the glasseous layer. These layers are typically deposited over the active surface areas by chemical vapor deposition in low pressure or atomspheric pressure, or in a plasma enhance reactive chamber.

The contact windows or openings are now formed through the insulating layered structure to the source/drain regions 90 or the like in the device regions, and to the capacitor plates (only the top plate is shown with a opening thereto, but the bottom plate will also be contacted) This process step is conventionally done by lithography and etching techniques which perferably use a reactive ion etching process that will anisotropically etch both components of the insulating layer structure 92. A typical reactive ion etching process using fluorine containing etching chemical species. These oxide/glass layers etching processes are well known to those in the art. The size of the contact window opening can be as small as limitation of the etching and lithography patterning capability.

The metallurgical connection is completed by the blanket deposition of metal layer 94 which fills the openings in the insulating layer 92 as shown in FIG. 8. This metal layer 94 is deposited by conventional methods and may be aluminum, aluminum-silicon, aluminum-silicon-copper, conductively doped polysilicon, tungsten or the like.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit having double polycrystalline silicon capacitors and metal oxide silicon field effect devices which are compatible to one micrometer or less processing comprising:

forming a pattern of recessed oxide isolation on the surface of a monocrystalline silicon substrate which pattern separates surface regions of silicon from other such regions;

forming a gate dielectric layer on the surface of said surface regions of the silicon;

forming a first polycrystalline silicon layer over the said gate dielectric layer and said pattern of isolation wherein the first silicon layer having a suitable doping concentration for imparting high conductivity;

forming an undoped interpoly dielectric layer over the surface of said first polycrystalline silicon layer;

forming a second polycrystalline silicon layer over the said interpoly dielectric layer wherein the second silicon layer having a suitable doping concentration for imparting high conductivity and the dielectric layer being left undoped;

patterning the second polycrystalline silicon layer using a first resist masking and suitable etching to leave only the top plate of said capacitor in said second polycrystalline silicon layer;

removing the said interpoly dielectric layer except where it is located beneath said top plate by using said top plate of said capacitor in said second polycrystalline silicon layer as the etching mask;

patterning the first polycrystalline silicon layer using a second resist masking and etching to leave only the bottom plate of said capacitor and the gate electrode of said transistor in said first polycrystalline silicon layer;

removing said second resist masking layers;

wherein said first resist masking layer remains on the surface of the top plate after the deposition of the second resist masking layer and during the patterning of the first polycrystalline silicon layer, and said resist masking layer forms a larger said bottom plate in the first polycrystalline layer than the top plate of the said double polycrystalline silicon layer capacitor; and completing the elements of the said integrated circuit and making electrical connections thereto to thereby form said integrated circuit.

2. The method of claim 1 wherein the said double polycrystalline silicon capacitors are located on the surfaces of the recessed oxide isolation pattern.

3. The method of claim 1 wherein said gate dielectric layer is a thermally formed silicon oxide having a thickness between about 70 to 200 Angstroms.

4. The method of claim 1 wherein said first and second polycrystalline silicon layers are deposited by low pressure chemical vapor deposition without doping and are subsequently doped by phosphorus P31 ion implantation.

5. The method of claim 1 wherein said first and second polycrystalline silicon layers are formed by low pressure chemical vapor deposition and are doped in situ with phosphorus.

6. The method of claim 1 wherein said interpoly dielectric is deposited by thermal oxidation and low pressure chemical vapor deposition and is composed of silicon oxide and silicon nitride and has a total thickness of between about 200 to 700 Angstroms.

7. The method of claim 6 wherein the said interpoly dielectric in ONO.

8. The method of claim 1 wherein the said completing the elements include forming the source/drain regions using the said gate electrode as part of the mask during ion implantation of the dopants.

9. The method of claim 1 wherein the said making electrical connections include formation of passivation layers, opening through said passivation layers to the said capacitor plates and the source/drain and gate electrodes of the field effect transistors.

10. The method of claim 1 wherein said first and second polycrystalline silicon layers are each between about 1500 to 5000 Angstroms in thickness and are doped with phosphorus.

11. A method for fabricating an integrated circuit having double polycrystalline silicon capacitors and metal oxide silicon field effect devices which are compatible to one micrometer or less processing comprising:

forming a pattern of recessed oxide isolation on the surface of a monocrystalline silicon substrate which pattern separates surface regions of silicon from other such regions;

forming a gate dielectric layer on the surface of said surface regions of the silicon;

forming a first polycrystalline silicon layer over the said gate dielectric layer and said pattern of isolation wherein the first silicon layer having a suitable doping concentration for imparting high conductivity;

forming an undoped interpoly dielectric layer over the surface of said first polycrystalline silicon layer;

forming a second polycrystalline silicon layer over the said interpoly dielectric layer wherein the second silicon layer having a suitable doping concentration for imparting high conductivity and the dielectric layer being left undoped;

patterning the second polycrystalline silicon layer using a first resist masking and suitable etching to leave only the top plate of said capacitor in said second polycrystalline silicon layer;

removing the said interpoly dielectric layer except where it is located beneath said top plate by using said top plate of said capacitor in said second polycrystalline silicon layer as the etching mask;

patterning the first polycrystalline silicon layer using a second resist masking together with the remaining first resist mask over the top plate of said capacitor and etching to leave only the bottom plate of said capacitor and the gate electrode of said transistor in said first polycrystalline silicon layer;

removing said first and second resist masking layers;

and making electrical connections thereto to thereby form said integrated circuit;

wherein said first and second polycrystalline silicon layers are deposited by low pressure chemical vapor deposition without doping and are subsequently and immediately before another layer is formed doped by phosphorus P31 ion implantation and said interpoly dielectric is formed by thermal oxidation and low pressure chemical vapor deposition and is composed of silicon oxide and silicon nitride and has a total thickness of between about 200 to 700 Angstroms.

12. The method of claim 11 wherein the said double polycrystalline silicon capacitors are located on the surfaces of the recessed oxide isolation pattern.

13. The method of claim 11 wherein the said first resist masking layer forms a larger said bottom plate in the first polycrystalline layer than the top plate of the said double polycrystalline silicon layer capacitor.

14. The method of claim 11 wherein further comprising forming the source/drain regions of said integrated circuit using the said gate electrode as part of the mask during ion implantation of the dopants.

15. The method of claim 11 wherein the said making electrical connections include formation of passivation layers, opening through said passivation layers to the said capacitor plates and the source/drain and gate electrodes of the field effect transistors.

16. The method of claim 11 wherein said first and second polycrystalline silicon layers are each between about 1500 to 5000 Angstroms in thickness and are doped with phosphorus.

* * * * *